(12) United States Patent
Bloch et al.

(10) Patent No.: US 7,106,143 B2
(45) Date of Patent: Sep. 12, 2006

(54) METHOD FOR ACHIEVING HIGHLY REPRODUCIBLE ACCELERATION INSENSITIVE QUARTZ CRYSTAL OSCILLATORS

(75) Inventors: Martin Bloch, Mitchel Field, NY (US); Oleandro Mancini, Mitchel Field, NY (US); Charles Stone, Mitchel Field, NY (US)

(73) Assignee: Frequency Electronics, Inc., Mitchel Field, NY (US)

( * ) Notice: Subject to any disclaimer, the term of this patent is extended or adjusted under 35 U.S.C. 154(b) by 44 days.

(21) Appl. No.: 11/096,318

(22) Filed: Mar. 31, 2005

(65) Prior Publication Data

US 2005/0242893 A1 Nov. 3, 2005

Related U.S. Application Data

(60) Provisional application No. 60/558,665, filed on Mar. 31, 2004.

(51) Int. Cl.
*H03B 1/04* (2006.01)
*H03B 5/32* (2006.01)
(52) U.S. Cl. .................. 331/65; 331/68; 331/158
(58) Field of Classification Search ............ 331/65–66, 331/68–70, 116 R, 116 FE, 158, 175–176
See application file for complete search history.

(56) References Cited

U.S. PATENT DOCUMENTS 4,453,141 A 6/1984 Rosati
4,949,055 A * 8/1990 Leitl .......................... 331/158
5,323,083 A 6/1994 Smythe et al.
6,707,346 B1 * 3/2004 Tillotson et al. ............ 331/175

FOREIGN PATENT DOCUMENTS

JP 60207237 10/1985
JP 63119199 5/1988

OTHER PUBLICATIONS

Rosati, Vincent J., Suppression of Vibration-Induced Phase Noise In Crystal Oscillators: An Update, 41$^{st}$ Annual Frequency Control Symposium—1987.
Hideo Kawahara, Japanese Office Action Mailing Date Aug. 31, 2004, and English translation.

* cited by examiner

*Primary Examiner*—David Mis
(74) *Attorney, Agent, or Firm*—Brown Raysman Millstein Felder & Steiner LLP (57) ABSTRACT

An oscillator and a method for producing an improved oscillator that will generate an accurate frequency when encountering a vibration. The oscillator and method uses a crystal with minimal cross-axis coupling. Further, a first accelerometer produced using MEMS technology is used. The first accelerometer is positioned inside of the oscillator so that the accelerometer accurately measures any vibration encountered by the oscillator. The first accelerometer and the crystal are maintained at constant temperature to minimize phase shifts and gain variations.

24 Claims, 12 Drawing Sheets

BROADBAND VIBRATION 10 Hz to 1000 Hz
($0.008\ g^2/Hz$)

FIXTURE RESONANCE OBSERVED AT APPROXIMATELY 900Hz

FIG. 17

METHOD FOR ACHIEVING HIGHLY REPRODUCIBLE ACCELERATION INSENSITIVE QUARTZ CRYSTAL OSCILLATORS

RELATED APPLICATIONS

This application is based on U.S. Provisional Patent Application No. 60/558,665, filed Mar. 31, 2004.

FIELD OF THE INVENTION

The present invention generally relates to quartz crystal oscillators for applications in systems such as precision navigation, radar, commercial and secure communications, space exploration, target acquisition, munitions, and missile guidance, and, more particularly, to a method for producing the quartz crystal oscillators that are used in these systems such that the effects of acceleration or vibration on the output signal of the quartz crystal oscillator in applications is minimized.

BACKGROUND OF THE INVENTION

Stress compensated ("SC") cut quartz crystals have been extensively used as the resonating element in oscillator circuits as a reliable element to generate accurate frequencies. Under static conditions, i.e., an acceleration-free (vibration-free) environment, a well-designed SC-cut quartz crystal oscillator when powered will produce an output signal at a particular carrier frequency with relatively low sideband frequencies with respect to the carrier frequency. However, when the same oscillator is subjected to acceleration or to changes in spatial orientation, undesirable spurious sidebands occur in the output signal. Depending on the particular application of the oscillator, these spurious sidebands, as well as unwanted signal noise, can translate into overall system errors when motion and vibration are encountered. The effects on a quartz crystal resonating element of both periodic and random acceleration (vibration) have been well documented. However, known methods for compensating for the acceleration effects have not resulted in a sufficiently compensated crystal that can be produced with good commercial yields with economies of manufacturing.

In addition, oscillators may be subject to changes in spatial orientation, i.e., the oscillator may be mounted in a vertical position inside an instrument that is positioned on a non-vibrating platform such as a laboratory worktable. The instrument may be moved and turned 90 degrees on its side resulting in the oscillator changing its spatial orientation or positioning by 90 degrees and, thus, resulting in degradation to the oscillator's output signal. Better techniques and methods to adequately compensate for changes in spatial orientation are needed. Specifically, an apparatus and methodology is needed that seamlessly compensates from 0 Hz (no vibration but changes in spatial orientation) to 2000 Hz (with sinusoidal and/or random vibration and high g-levels). It is believed that no previously known method has ever economically compensated for both the effects of changes in oscillator spatial orientation, i.e., 0 Hz, and for higher vibration frequencies.

What has been needed and heretofore unavailable is a quartz crystal resonating element that both can effectively compensate for a broad range of conditions, such as changes in oscillator spatial orientation and periodic and random vibration effects, and a method for fabricating the oscillator that is highly reproducible and permits high yields at an optimum manufacturing cost. The present invention satisfies these needs.

BRIEF SUMMARY OF THE INVENTION

A quartz crystal oscillator and a method for fabricating the same is disclosed whereby a highly reproducible manufacturing process is used to cost effectively yield quartz crystal oscillators that are insensitive to acceleration and changes in spatial orientation. According to one aspect of the invention, the oscillator that results from the fabrication process will exhibit nominal spurious sidebands about the reference frequency in the presence of acceleration or vibration or in response to changes in spatial orientation. Desirably, a crystal with minimal cross-axis coupling is used in the oscillator. An accelerometer, such as one manufactured using Micro Electromechanical System ("MEMS") technology, is positioned inside the oscillator. As will be apparent to one with skill in the art, an accelerometer manufactured with some other technology (e.g., nanotechnology) that is sufficient to keep the size of the accelerometer small enough to fit inside the oscillator housing can also be used in keeping with the invention. While the accelerometer can be located anywhere inside the oscillator housing, for optimum results it is preferable to position the accelerometer proximate to the quartz crystal resonator so that the accelerometer will accurately measure any vibration encountered by the crystal resonator. In the oscillator, close to constant temperature is maintained at or around the crystal and the accelerometer, which helps to minimize changes in the acceleration and vibration response of the crystal.

According to another aspect of the invention, the oscillator experiences minimal degradation in the frequency it generates. Here, the oscillator also uses a crystal resonator with minimal cross-axis coupling and at least one accelerometer. Where only one accelerometer is used, it is attached directly to a surface of the crystal so that it lies parallel to one of the orthogonal axes of the crystal. Where three accelerometers are used, each of the accelerometers is positioned so that the axes of the accelerometers are mutually orthogonal.

According to another aspect of the invention, the position of the crystal within the oscillator and the positional orientation of the crystal may be arbitrarily selected, without restrictions such as restrictions dictated by the size or other dimensions of the oscillator housing or package.

According to still another aspect of the invention, the accelerometer(s) can be attached to the crystal holder or placed anywhere inside the oscillator housing, provided that the accelerometer(s) are also placed as closely as possible to the oscillator's crystal resonator. When more than one accelerometer is used, the acceleration axes of the accelerometers must be mutually orthogonal for optimum results.

DETAILED DESCRIPTION OF THE PREFERRED EMBODIMENTS

Figure 1:
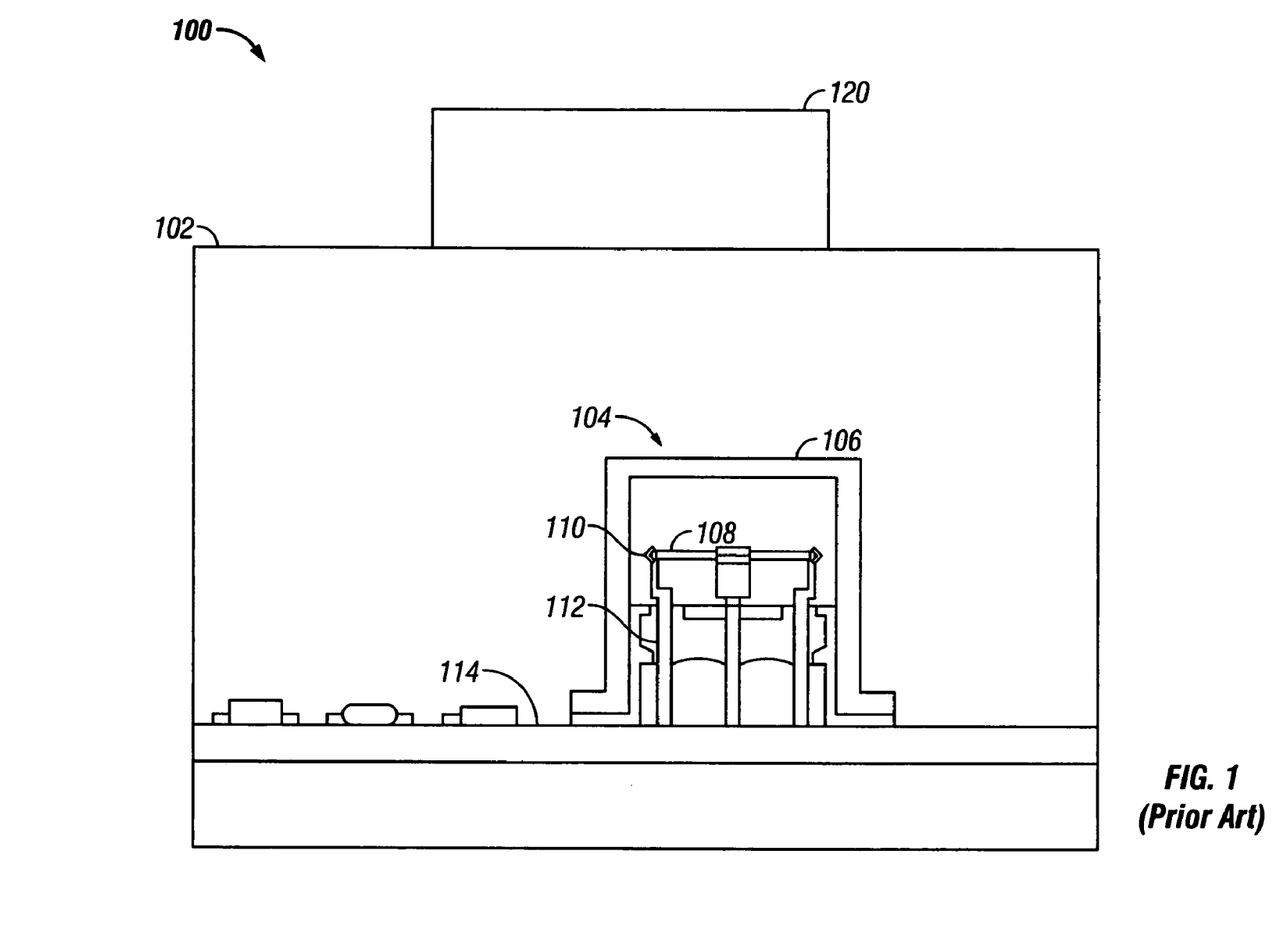
FIG. 1 is a cross-sectional view of an oscillator in which traditional compensating techniques have been implemented.

Referring now to the drawings, wherein like reference numerals denote like or similar elements throughout the drawings, and more particularly to FIG. 1, a prior art oscillator with an accelerator placed outside the oscillator housing is shown. With such oscillators, the compensating techniques used to minimize degradation resulting from vibration-induced sidebands are necessarily dependent on readings from accelerometers that are physically located at some distance from the crystal resonator itself to measure vibration effects. Because the accelerometers are not directly proximate to the oscillator's crystal resonator, the readings from the accelerometer do not directly effect a measure of the vibration being experience by the crystal. In these prior art techniques, after a vibration is detected and inaccurately measured, the compensating scheme or method has traditionally attempted to cancel out a slightly different modulation waveform, or sometimes a significantly different modulation waveform, from the actual waveform generated by the vibration.

In FIG. 1, a prior art oscillator 100 is shown in which traditional compensating techniques have been implemented. The oscillator 100 has an oscillator housing 102 which houses the internal components of the oscillator 100. Housed within the oscillator housing 102, a quartz crystal resonator 104 is used as a resonator. The quartz crystal resonator 104 includes a crystal housing 106 which houses a crystal blank 108. The crystal blank 108 is held in place by a crystal holder 110. The crystal holder is connected to a plurality of pins 112. In addition, a circuit card 114 lies within the bottom portion of the oscillator housing 102. A portion of the circuit card 114 lies beneath the crystal housing 106 and is connected to the plurality of pins 112. The circuit card in some applications may be mounted in other orientations with respect to the crystal housing.

A non-miniaturized accelerometer 120 is positioned on the top of the surface of the oscillator housing 102 to measure the effects of vibration experienced by the oscillator. Alternatively, the accelerometer 120 can be positioned on a side of the oscillator housing 102. As will be appreciated by those with skill in the art, in this approach, the accelerometer 120 is simply too large to be placed within the oscillator housing 102. What the accelerometer 120 is actually measuring then, is the vibration experienced by the oscillator 100, and not the actual vibration experienced by the side-band-producing crystal blank 108. The oscillator 100 and the crystal blank 108 will likely react differently to the forces that are causing the vibration, so the accelerometer 120 positioned on the oscillator housing 102 will not provide the most accurate measure of what is being experienced by the crystal blank 108. One reason for this is that the oscillator housing 102 on which the accelerometer 120 rests is much sturdier and, therefore, more resistant to the forces that are causing any vibration. The forces being experienced by the crystal blank 108, which is in a more sensitive location inside the oscillator housing 102, thus will be different than the forces being experienced by the accelerometer 120. The oscillator 100 has the much sturdier oscillator housing 102 than the more sensitive crystal blank 108. In addition, in the prior art oscillator 100, changes in spatial orientation of the oscillator at 0 Hz will not be economically compensated for, as the prior art accelerometers are limited to around 1 or 2 Hz, hence unable to react to spatial changes at 0 Hz.

Referring now to FIG. 2-17 there is shown an improved oscillator and a method for fabricating the same.

Figure 2:
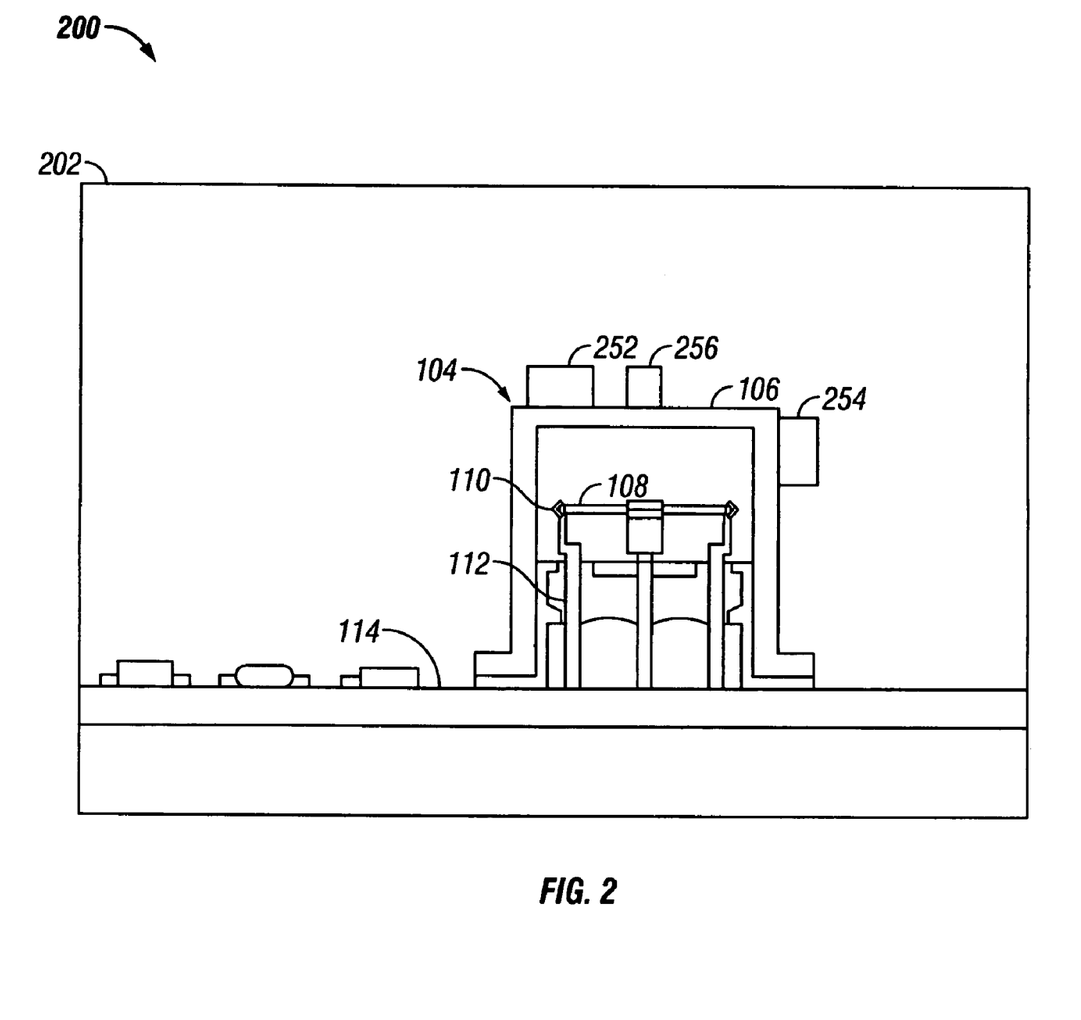
FIG. 2 is a cross-sectional view of an oscillator having compensating devices placed on the quartz crystal housing in accordance with one embodiment according to the invention.

With reference now to FIG. 2, the vibration of a quartz crystal resonator can be more accurately measured than through the traditional approaches in an oscillator fabricated in accordance with the method of the invention. In FIG. 2, an oscillator 200 having an oscillator housing 202 is shown. A first accelerometer 252 is attached directly to the quartz crystal housing 106. By placing the first accelerometer 252 directly on the quartz crystal housing 106 (as opposed to placing it on the oscillator housing 202), the first accelerometer 252 is more proximate to the crystal blank 108 and can therefore provide a better measurement of the vibration of the crystal blank 108 than the traditional accelerometer 120 shown in FIG. 1.

Placing the first accelerometer 252 directly on the quartz crystal housing 106 is a very difficult task. Prior to the development of miniaturized accelerometers, accelerometers were simply too large to be positioned on the quartz crystal housing 106. An accelerometer manufactured with MEMS technology, however, is small enough and light enough to be positioned directly on the crystal housing 106. Thus, MEMS accelerometers are one type of element that can be used to economically compensate for both spatial orientation changes, i.e., 0 Hz, and changes in the acceleration and vibration response of the crystal resonator. Accelerometers manufactured using technologies of an even smaller scale, such as nanotechnology, also might be used with good results in the method according to the invention.

Optionally, a second accelerometer 254 is positioned on a side of the crystal housing 106. The second accelerometer 252 can measure the vibration of the crystal blank 108 along one axis while the first accelerometer 254 can measure the vibration of the crystal blank 108 along another axis. The oscillator 200 can then compensate for the degradation caused by the vibration of the crystal blank 108 by canceling signals along each of these axes.

In another embodiment according to the invention, a first accelerometer 252, a second accelerometer 254, and a third accelerometer 256 are positioned on the top and sides of the crystal housing 106. The first accelerometer 252 can measure the vibration of the crystal blank 108 along one axis while the second accelerometer 254 can measure the vibration of the crystal blank 108 along a second axis and the third accelerometer 256 can measure the vibration of the crystal blank 108 along a third axis. The oscillator 200 can then compensate for the degradation caused by the vibration of the crystal blank 108 by canceling signals along each of these axes.

A number of permutations of approaches can be implemented where two accelerometers are placed on the side of the crystal housing 106 and one on top of the crystal housing 106 and where all accelerometers are placed mutually orthogonal to each other. Right angle brackets or other convenient brackets can also be used to position the accelerometers on the crystal housing 106. The accelerometers are fastened to the right angle bracket in a mutually orthogonal orientation and then the right angle bracket carrying the accelerometers is affixed to crystal housing 106. Using the angle bracket simplifies manufacture of the assembly, since the procedure of correctly mounting the MEMS accelerator on the right angle bracket is performed as a separate process with adequate room outside of the cramped quarters of the oscillator. Also, the conveniently angled bracket simplifies the attachment of the MEMS accelerometers to the crystal housing 106, especially since a crystal housing 106 may not necessarily be flat but may be sloped or ridged on the top or side surfaces. Adhesives known to one of ordinary skill in the art are used to attach the conveniently angled bracket to virtually any type of crystal housing.

In another embodiment according to the invention, packages containing a plurality of miniaturized accelerometers can be used. For example, two MEMS accelerometers (i.e., a first accelerometer 252 and a second accelerometer 254) can be oriented in a single package so that the axes of the accelerometers are mutually orthogonal. If it is desired to use a first accelerometer 252, a second accelerometer 254, and a third accelerometer 256, two packages, each containing two MEMS accelerometers, can be used, with three of the accelerometers being oriented so that their axes are mutually orthogonal and the fourth accelerometer being unused. That is, the first accelerometer 252 and the second accelerometer 254 in one MEMS package compensates for two of the axes, and one of the two accelerometers in the second MEMS package supplies the third accelerometer 256 to compensate on the third axis.

The conveniently angled bracket described above can also be used in this embodiment. A number of permutations of approaches can be implemented where two accelerometers containing two mutually orthogonal axes in each respective package are placed on the side of crystal housing 106 and one on top of the crystal housing 106 and where all accelerometers are placed mutually orthogonal to each other.

In alternative embodiments according to the invention, either MEMS accelerometers or other miniaturized acceleration-compensating technologies (e.g., accelerometers manufactured using nanotechnology techniques) can be used to a make a single package containing three accelerometers within a single package. In this case, only one package of accelerometers will be necessary to provide the first accelerometer 252, the second accelerometer 254, and the third accelerometer 256 to provide compensation on all three orthogonal axes of the quartz crystal resonator 108. This single package may be affixed to any location on crystal housing 106, either directly or with a conveniently angled bracket as described above.

Figure 3:
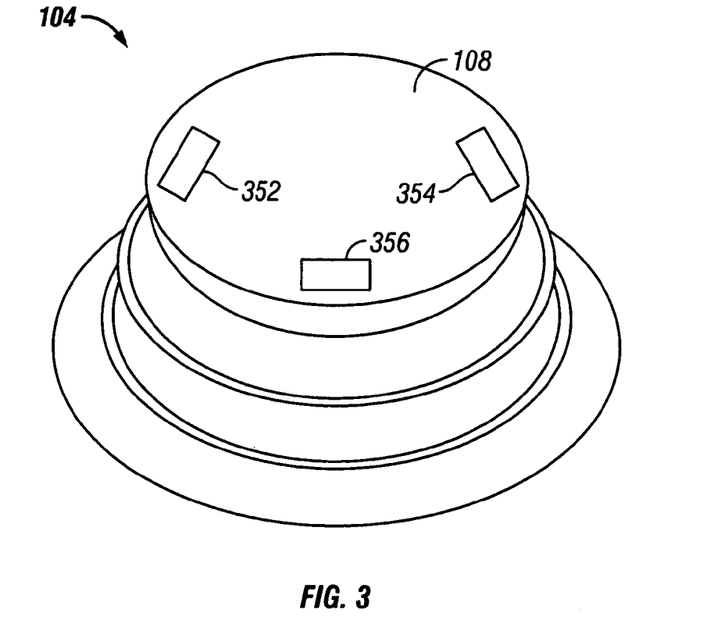
FIG. 3 is a perspective view of another embodiment according to the invention in which the compensating devices of the oscillator are placed directly on the crystal blank.

In yet in another embodiment according to the invention, and referring now to FIG. 3, one or more packages containing miniaturized accelerometers are placed directly on the quartz crystal resonator 104. Three single-axis accelerometers, a first accelerometer 352, a second accelerometer 354, and a third accelerometer 356, are placed so that their axes are mutually orthogonal. A first accelerometer 352, a second accelerometer 354, and a third accelerometer 356 are placed directly on the top surface of the crystal blank 108. Alternatively, a first accelerometer 352 and a second accelerometer 354 are placed directly on the top surface of the crystal blank 108 of the quartz crystal resonator 104 and a third accelerometer 356 is placed on a side surface of the crystal blank 108, where the axes of the accelerometers are all mutually orthogonal.

As will be apparent to one skilled in the art, a plurality of permutations with respect to the placement of the first accelerometer 352, the second accelerometer 354, and the third accelerometer 356 are possible. As described above, accelerometer packages that contain two accelerometers per package require a minimum of two such packages to be placed on the crystal in any convenient location, but the chosen accelerometer axes must be mutually orthogonal to one another. Also, as described above, a single package containing three accelerometers within a single package can be used. In the latter case, only one MEMS package, or only one package using some other suitable miniaturized technology, is used and affixed to any convenient location on the quartz crystal resonator 104.

In one embodiment according to the invention, a well-mounted (i.e., without mount resonances or cross-axis motional coupling) SC-cut type of crystal is particularly adaptable to this type of compensation, because it responds in such a way that rigorous, precise, stable, linear superposition of the influences is exhibited. The influences include acceleration measured independently along each of three arbitrary but orthogonal axes, electrode voltage having DC and low frequency spectral components, and varactor-type tuning.

The SC-cut quartz crystal is particularly sensitive to DC potential across the crystal electrode. Hence, applied small voltage changes are sufficient to compensate the SC-cut crystal for various G-variations.

Figure 4:
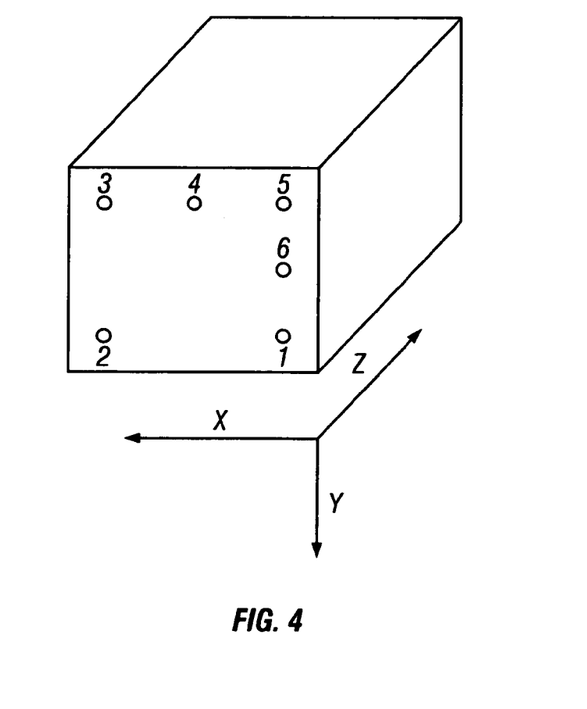
FIG. 4 is a schematic view of three axes that are used for placement of accelerometers according to one embodiment of the invention.
Figure 5:
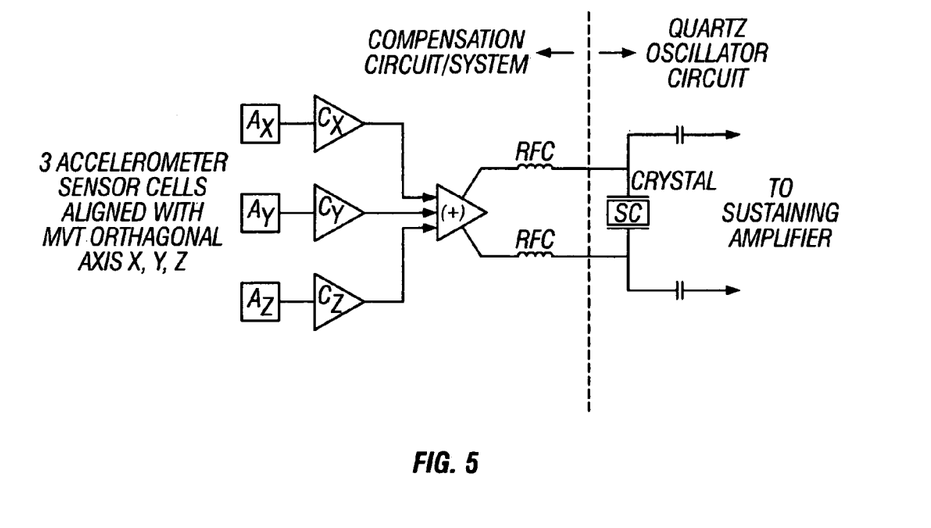
FIG. 5 is a circuit diagram for a compensation circuit that can be used with one or more embodiments according to the invention in order to compensate for degradation caused by sidebands.

In another embodiment according to the invention the oscillator used is a FE-101A Low-G Sensitivity Unit manufactured by Frequency Electronics, Inc. Referring now to FIG. 4, three axes (e.g., ax-axis, ay-axis and az-axis) are selected relative to the FE-101A enclosure. Three MEMS accelerometer sensor cells may be mounted so that their axes are parallel to the three axes shown in FIG. 4. The three accelerometer outputs are individually given signed weights prior to summing. The weight and sign are determined experimentally for each individual axis. A value is found that can be applied to the accelerometer signal before being summed into the electrodes of the SC-cut crystal, such that the value exactly cancels the modulation induced in the crystal frequency by a test vibration along the axis. This value is the weight and sign. Linear superposition insures that the weighted contributions of the three accelerometers when summed cancel simultaneously the responses of the crystal to complex accelerations resolved among the three axes. In one embodiment according to the invention, as illustrated in FIG. 5, a compensator circuit system compensates for degradation caused by side bands.

Figure 6:
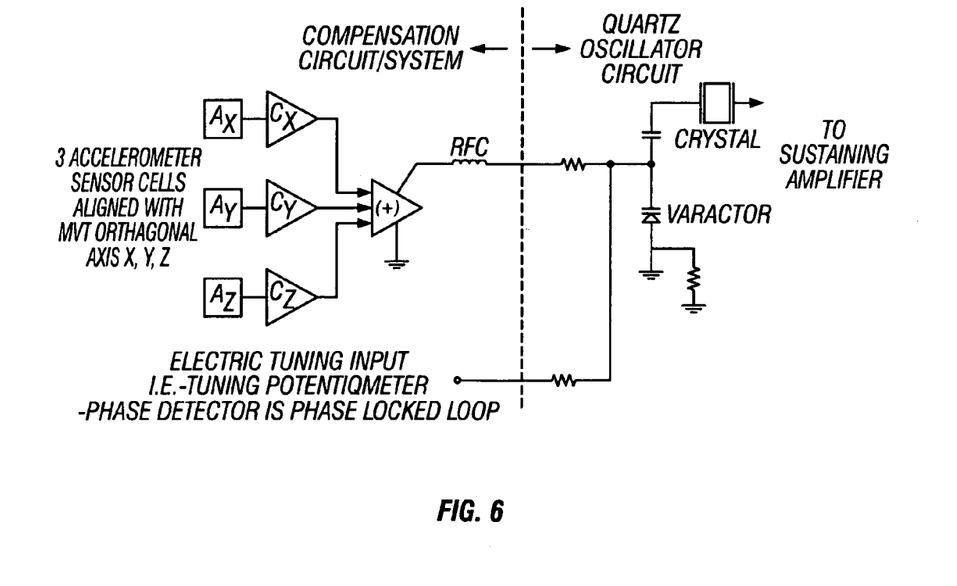
FIG. 6 is a circuit diagram for another compensation circuit that can be used with one or more embodiments according to the invention in order to compensate for degradation caused by sidebands.
Figure 7A:
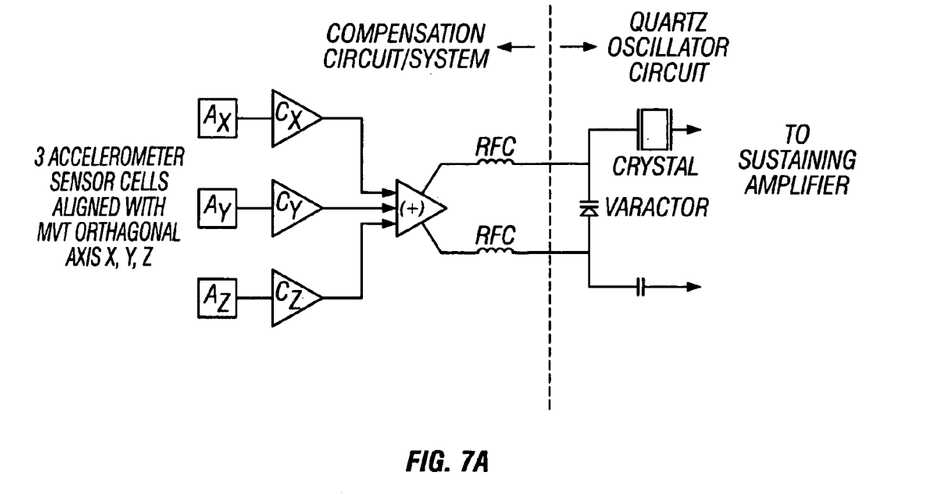
FIG. 7A is a circuit diagram for another compensation circuit that can be used with one or more embodiments according to the invention in order to compensate for degradation caused by sidebands.
Figure 7B:
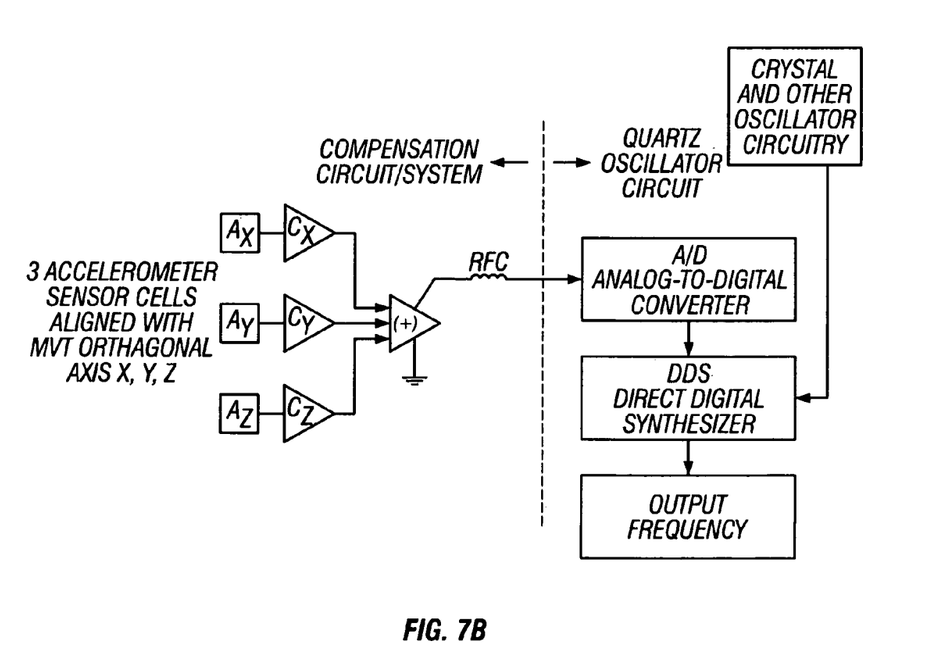
FIG. 7B is a circuit diagram for still another compensation circuit that can be used with one or more embodiments according to the invention in order to compensate for degradation caused by sidebands.

Optionally, an alternative compensatory circuit system such as the one illustrated in FIG. 6 may be used. Additionally, different compensatory circuit systems such as those illustrated in FIGS. 7A and 7B may also be used.

Referring again to FIG. 5, the accelerometer cell $A_x$ only responds with an acceleration measurement along the x-axis. The accelerometer cell $A_x$ is sent to a conditioning circuit $C_x$ that applies a sign and weight in addition to a value to the $A_x$ signal. Further, the accelerometer cell $A_y$ coordinates with a conditioning circuit $C_y$ in a similar manner. Accordingly, the accelerometer cell $A_z$ coordinates with a conditioning circuit $C_z$ in a similar manner. The conditioning circuits $C_x$, $C_y$, and $C_z$ determine the weights, signs, and values so that the sum of each of the signals outputted from $C_x$, $C_y$, and $C_z$ is zero thus canceling out the vibration encountered.

In one embodiment according to the invention, the inductance in the compensator circuit system is chosen to prevent interaction between the crystal and the compensation circuit at the oscillator's RF operating frequency, while conducting the low frequency compensation signal to crystal electrodes.

In yet another embodiment according to the invention, the capacitance in the compensator circuit system is chosen with the objective of conducting the crystal current RF signal circulating in the oscillator's feedback loop, while preventing the compensator circuit signal present at the crystal electrodes from entering the sustaining amplifier circuit or varactor circuits.

A series of steps can be performed for setting up and calibrating the oscillator 200 (shown in FIG. 2) with the compensator circuit system along each of the axes that the accelerometers are positioned on or parallel to. The RF output of the oscillator is connected to a modulation monitor. An example of a modulation monitor is a suitable spectrum analyzer or a phase noise test set.

In one embodiment, $C_x$, $C_y$, and $C_z$ are calibrated as follows. First, to calibrate $C_x$, the oscillator is mounted on a vibration table set to provide approximately 2 g RMS so that the direction of acceleration is along the x-axis. The weighting values of $C_y$ and $C_z$ are set to zero so that any residual inadvertent responses from $A_y$ and $A_z$ do not contaminate the x-axis calibration. While the oscillator is mounted on the vibration table and excited at a conveniently low frequency, such as 20 Hz, the orientation of the oscillator is positioned such that the direction of motion is along the x-axis. Further, $A_x$ should respond with a corresponding signal. When all of these conditions are satisfied, sign and weight values are experimentally determined such that the sign and weight values exactly counterbalance, i.e., cancel, the vibration-induced frequency modulation of the oscillator, as measured at the modulation monitor by minimum side band energy.

After calibrating $C_x$, $C_y$ can be calibrated by restoring the setting of $C_x$ to zero and reorienting the oscillator so that the direction of the vibration is along the y-axis. $A_y$ provides a corresponding signal, while $A_x$ and $A_z$ have an approximate output of zero. In a similar fashion to the calibration of $C_x$, the sign/weight values are determined for $C_y$, which balance out the vibration induced modulation of the oscillator. Similarly, $C_z$ can be calibrated in a similar fashion to $C_x$ and $C_y$.

To complete the installation, calibration, and setting of the compensator system, the three values of sign/weight that are experimentally determined for $C_x$, $C_y$, and $C_z$, are installed permanently in $C_x$, $C_y$, and $C_z$. When the compensator is energized, cancellation of acceleration effects in any direction is achieved. For any acceleration, the three components have previously been cancelled individually. Therefore, by linear superposition, the three components are jointly cancelled to zero in the absence of cross-axis coupling.

Figure 8:
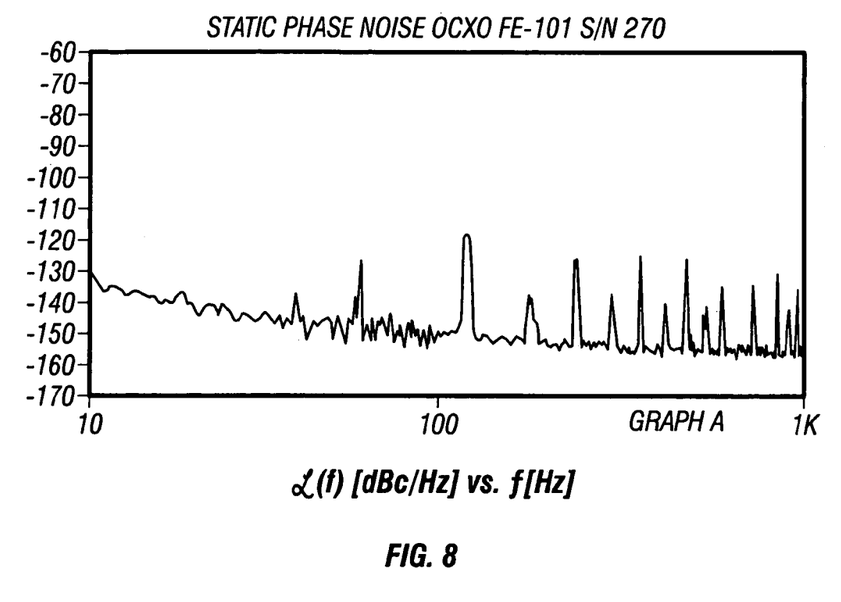
FIG. 8 is a graph of a typical static (at rest) phase noise response of an oscillator according to the invention that has not undergone acceleration.
Figure 9:
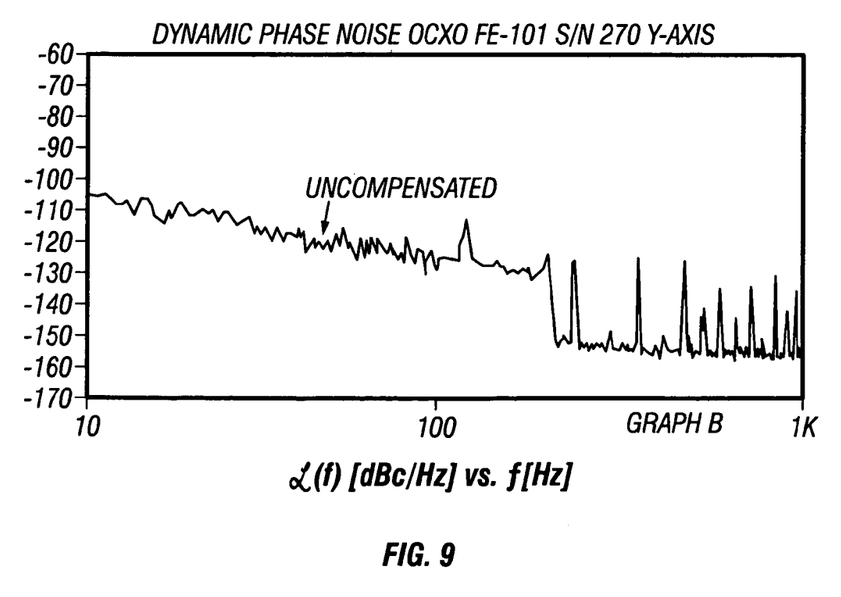
FIG. 9 is a graph of a typical dynamic phase noise response of an oscillator according to the invention that has undergone random acceleration applied in the y-axis without any compensation.
Figure 10:
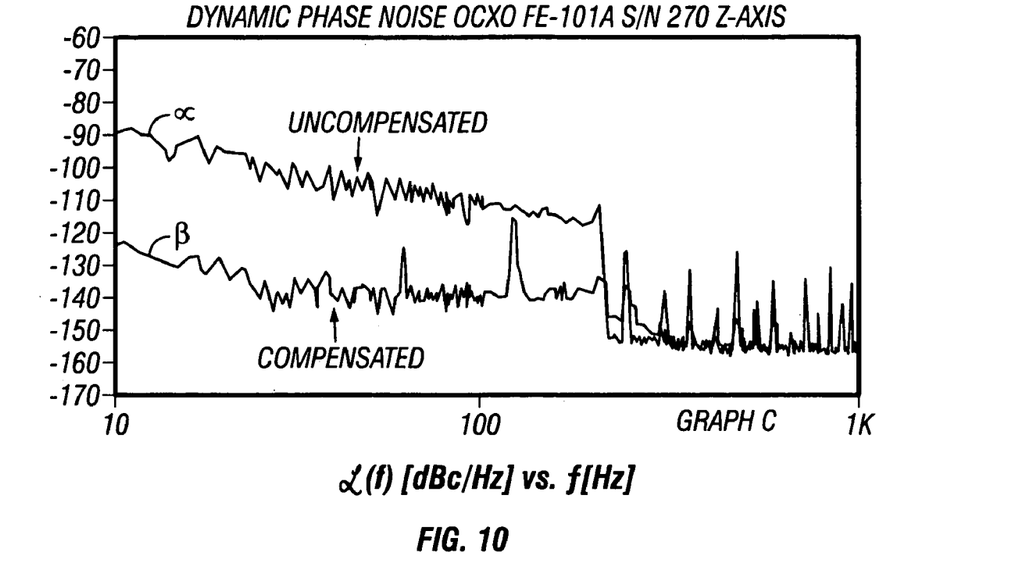
FIG. 10 is a composite graph having plots that depict the dynamic phase noise response of an oscillator according to the invention under both compensated and uncompensated conditions while undergoing random acceleration that is applied in the direction of the z-axis.
Figure 11:
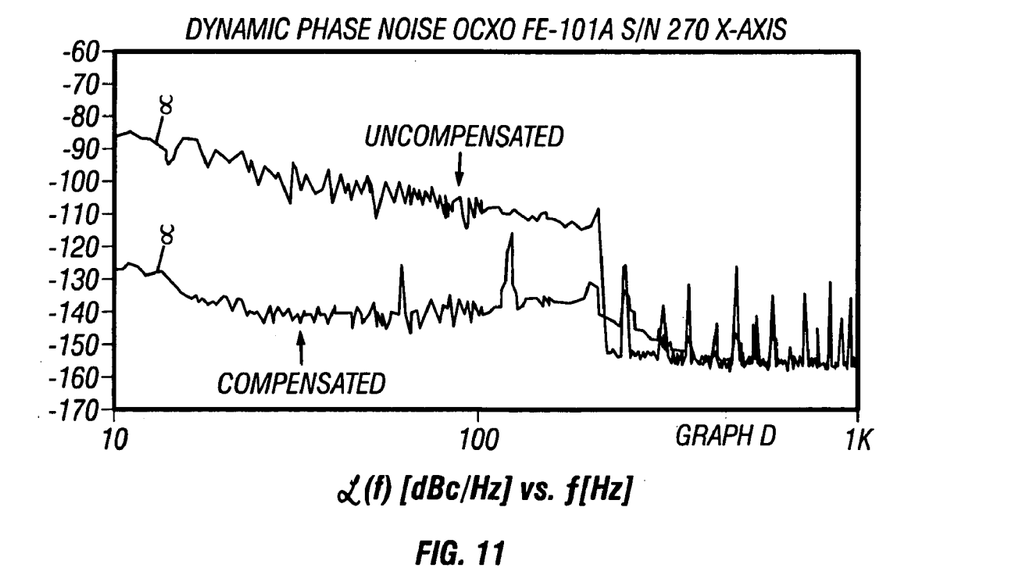
FIG. 11 is a composite graph consisting of plots of the dynamic phase noise response of an oscillator according to the invention under both compensated and uncompensated conditions while undergoing random acceleration that is applied in the direction of the x-axis.

In one embodiment, the compensator system can be used for two axes. FIGS. 8–11 illustrate, in graphic form, the results achieved in an experiment using a Frequency Electronics, Inc. FE-101A unit #270, 10.230 MHz oscillator that uses an SC-cut, third overtone crystal. This experiment was conducted by compensating only the x-axis and z-axis. The graph depicted in FIG. 8 illustrates static phase noise that has not undergone acceleration. The graph depicted in FIG. 9, however, illustrates uncompensated noise that has undergone acceleration. The significant degradation of the static phase noise depicted in the graph of FIG. 8 is apparent in the graph shown in FIG. 9. The graph shown in FIG. 10 illustrates a plot α that depicts the uncompensated noise of the graph in FIG. 8. Accordingly, FIG. 10 also illustrates a plot β that depicts compensated noise after the signal measured by the accelerometer is compensated in the compensator system. Finally, the graph of FIG. 11 illustrates a plot γ depicting uncompensated noise and a plot δ depicting compensated noise. As can be seen from the graphs shown in FIGS. 8, 10 and 11, the compensator system effectively minimizes degradation caused from noise so that the signal measured by the accelerometer is similar to the static phase noise signal.

Referring again to FIG. 3, another embodiment according to the invention is illustrated. A first accelerometer 352, a second accelerometer 354, and a third accelerometer 356 are each positioned directly on the crystal blank 108 to more accurately measure the vibration of the crystal blank 108 than through traditional approaches. As was discussed with respect to FIG. 2, the placement of the first accelerometer 252, the second accelerometer 254, and the third accelerometer 256 on the crystal housing 106 can more accurately measure the vibration of the crystal blank 108 than can be measured by placing the traditional accelerometer 120 on the oscillator housing 102 as shown in FIG. 1. However, as illustrated in FIG. 3, another accurate measure of vibration of the quartz crystal resonator 104 can be achieved by positioning accelerometers directly on the crystal blank 108. The mechanical coupling between the crystal blank 104 and the first accelerometer 352 provides the first accelerometer 352 with the ability to accurately measure the vibration experienced by the quartz crystal resonator 104, because the first accelerometer 352 experiences practically the same force as the crystal blank 108 since it is attached directly to it. This methodology allows the quartz crystal resonator 104 to be subjected to accelerations and to be simultaneously compensated, resulting in minimum adverse effects on the frequency response of the oscillator 200.

One of ordinary skill in the art will recognize that any number of accelerometers can be used to detect vibration. For highly sensitive, precision equipment, multiple accelerometers may be used to measure vibration along each axis. Using technology such as MEMS, for example, allows accelerometers to be miniaturized to a size that allows this type of arrangement. In some instances, it may also be desirable to place extra accelerometers in addition to along the orthogonal axes in order to achieve better compensation.

Figure 12:
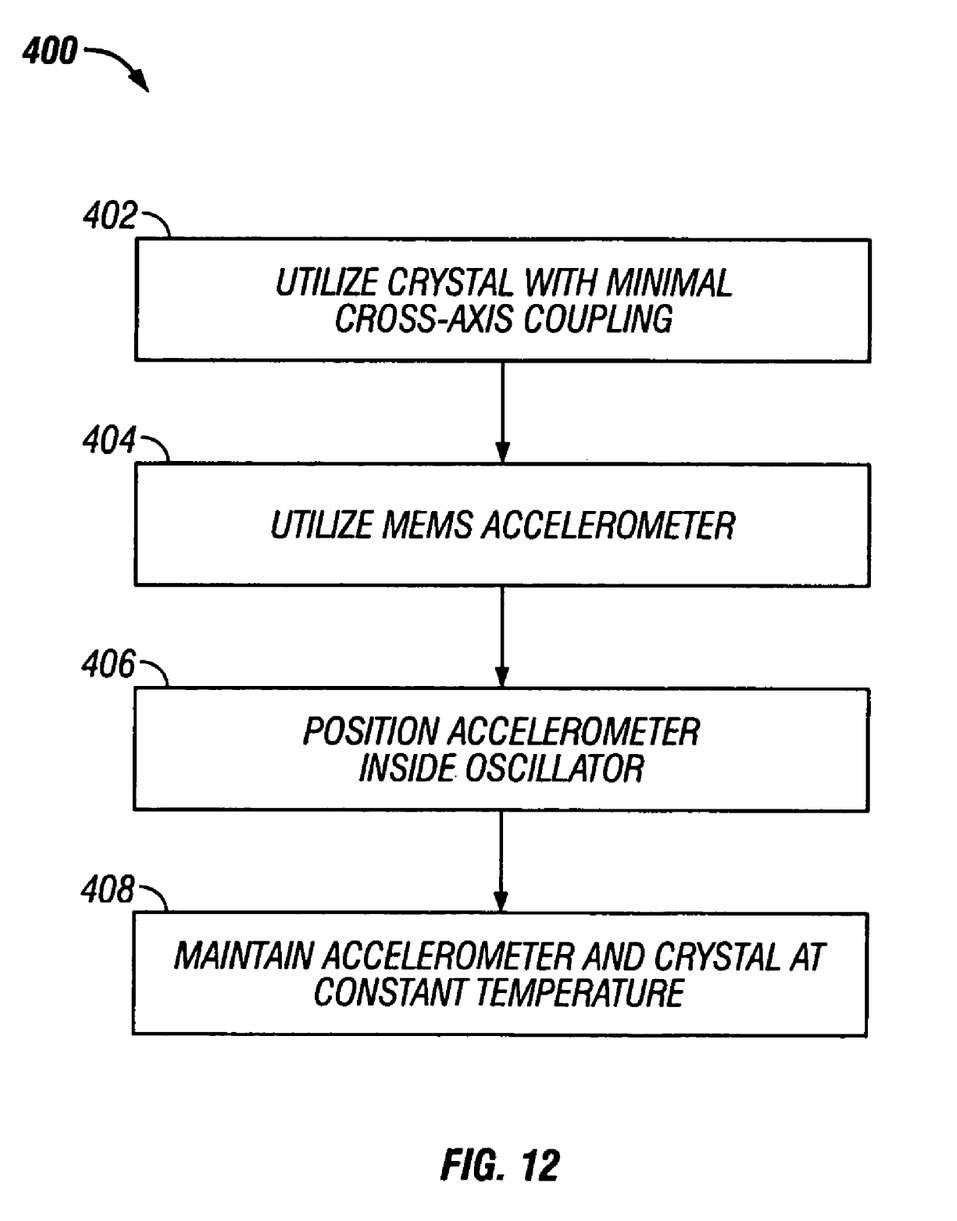
FIG. 12 is a schematic illustration of a method according to the invention by which a quartz crystal oscillator according to the invention can be fabricated.

Referring now to FIG. 12, a process or method 400 according to the invention that can be used to manufacture the quartz crystal resonator 104 for use in the oscillator 200 is illustrated. The process 400 provides a methodology for not only producing the oscillator 200 in a manner that will allow accurate measurements of the vibration being experienced by the quartz crystal resonator 104, but also for reproducing the quartz crystal resonator 104 and oscillator 200 in large quantities in a cost effective way.

Referring now to process block 402, first, a quartz crystal resonator 104 with minimal cross-axis coupling is selected for use in the oscillator 200. In order to produce oscillators 200 that will generate reliable signals, the quartz crystal used as the resonator should be of a high quality. When the oscillator 200 transmits a signal through the x-axis of the quartz crystal 104 to compensate for the degradation measured by an accelerometer, the y-axis and the z-axis should remain stable. In this instance, the stability of the y-axis and the z-axis is important because the oscillator also sends signals down these respective axes to minimize detected vibration along these axes. If the y-axis and z-axis undergo vibration in addition to the intended compensating vibration along these respective axes, the compensating scheme will be ineffective.

At the next process block 404, a MEMS accelerometer is used. As discussed above, MEMS or any other technology known to one of ordinary skill in the art can be used to miniaturize accelerometers for positioning directly on the crystal housing 106 or directly on the crystal blank 108. A traditional, non-miniaturized accelerometer 120 cannot be positioned on the crystal housing 106 or the crystal blank 108 because of its prohibitive size and weight. Recent technologies, such as MEMS, now provide the capability of producing miniature measurement devices, such as, accelerometers that are just as effective as measurement devices that are bulkier. Additionally, nanotechnology can also be used to produce miniature accelerometers suitable for use with an embodiment of the invention.

At the next process block 406, the accelerometer is positioned within the oscillator. The accelerometer is positioned directly on the crystal housing 106 or directly on the crystal blank 108. As discussed above, the purpose behind the use of accelerometers in an oscillator is to measure the vibration of the crystal not the oscillator. Conventional methods estimate the vibration of the crystal by positioning accelerometers on the oscillator. However, these vibration measurements are not accurate because the oscillator will react differently to vibration than the crystal. By positioning accelerometers on the quartz crystal resonator 104, the oscillator 200 is able to receive accurate vibration measurements on what is supposed to be measured.

Finally, at the next process block 408 in FIG. 12, the accelerometer and quartz crystal resonator are maintained at constant temperature. By positioning accelerometers on the quartz crystal resonator 104, the quartz crystal resonator 104 is essentially one integrated mass including accelerometers. Accordingly, an integrated mass should have a constant temperature. If the accelerometers have a different temperature than the quartz crystal resonator 104, the oscillator 200 will be receiving less accurate measurements as a result of the accelerometers and the quartz crystal resonator 104 not acting as an integrated mass. Finally, it is important to maintain a constant temperature to minimize phase shifts and gain variations. Temperature can have an effect on the vibration of the crystal. If the temperature changes after the accelerometer sends a vibration measurement to the oscillator, the oscillator will not receive an accurate measurement of the current vibration. As a result, the oscillator will send an inaccurate cancellation signal through the crystal, which will not minimize degradation in the most effective way.

Experiments have been conducted with the use of the process 400 according to the invention in order to reduce the degradation caused by side bands. An oscillator having an SC-cut quartz resonator was fabricated according to the process 400. The oscillator was a Frequency Electronics, Inc. FE-101A Low-G Sensitivity Unit. Tests were conducted under various conditions to determine the efficacy of the oscillator in minimizing degradation. Results of the experiments are depicted in the graphs of FIGS. 8–11 and FIGS. 13–17.

Figure 13:
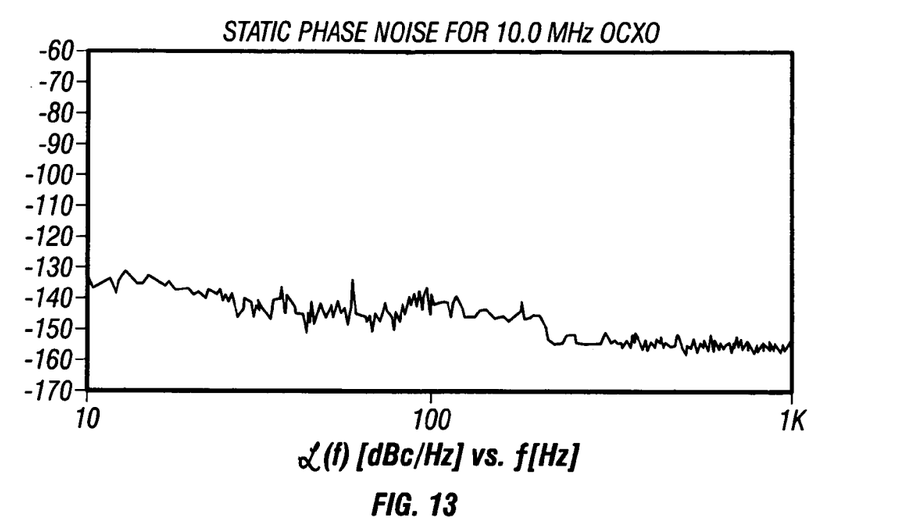
FIG. 13 is a graph of a typical static (i.e., at rest) phase noise response of an oscillator according to the invention that has not undergone acceleration.

The graph of FIG. 13 shows a plot of the side band phase noise under static conditions. No acceleration has been applied to the unit. As can be seen from the graph illustrated in FIG. 13, the plot demonstrates a relatively steady side band.

In order to determine how well the oscillator minimizes degradation, acceleration needs to be applied to the oscillator. The graph shown in FIG. 14 illustrates the output of the oscillator when acceleration is applied.

Plot λ illustrates the side bands under vibration measured without the benefit of compensation. The measured output under vibration without the benefit of compensation was approximately 80 dB/Hz at 10 Hz. Plot θ illustrates the minimization of the side bands under vibration through the use of an oscillator fabricated using the process 400. At 10 Hz, a significant improvement of over 40 dB can be seen. Further, at 200 Hz, an improvement of over 20 dB can be seen.

Figure 14:
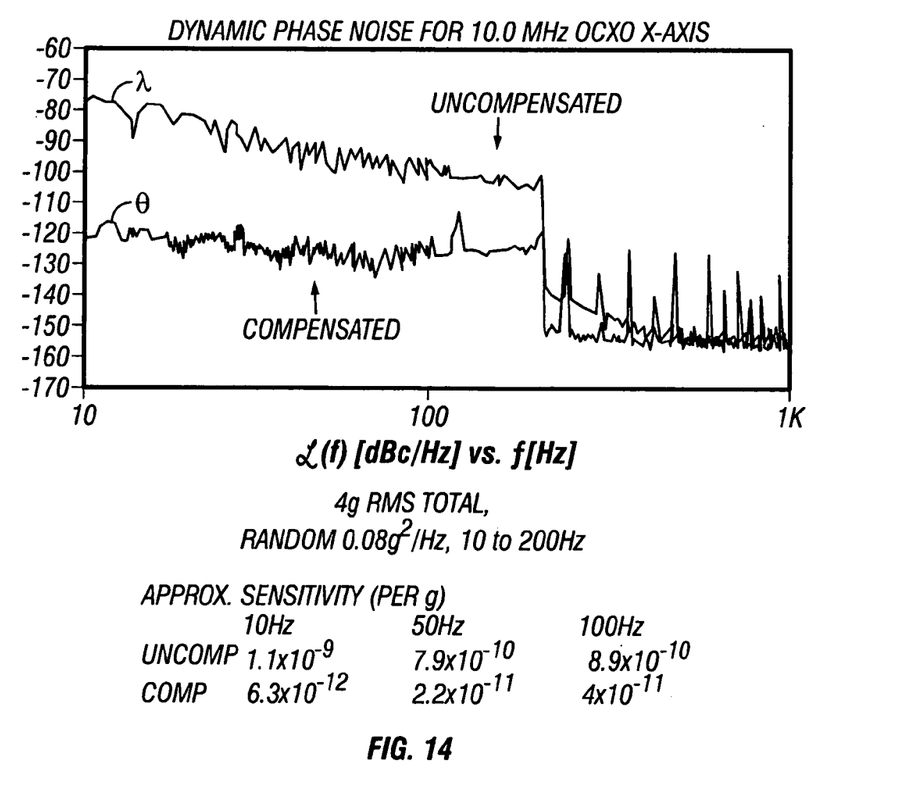
FIG. 14 is a composite graph consisting of plots of the dynamic phase noise response of an oscillator according to the invention under both compensated and uncompensated conditions while undergoing random acceleration that is applied in the direction of the x-axis.
Figure 15:
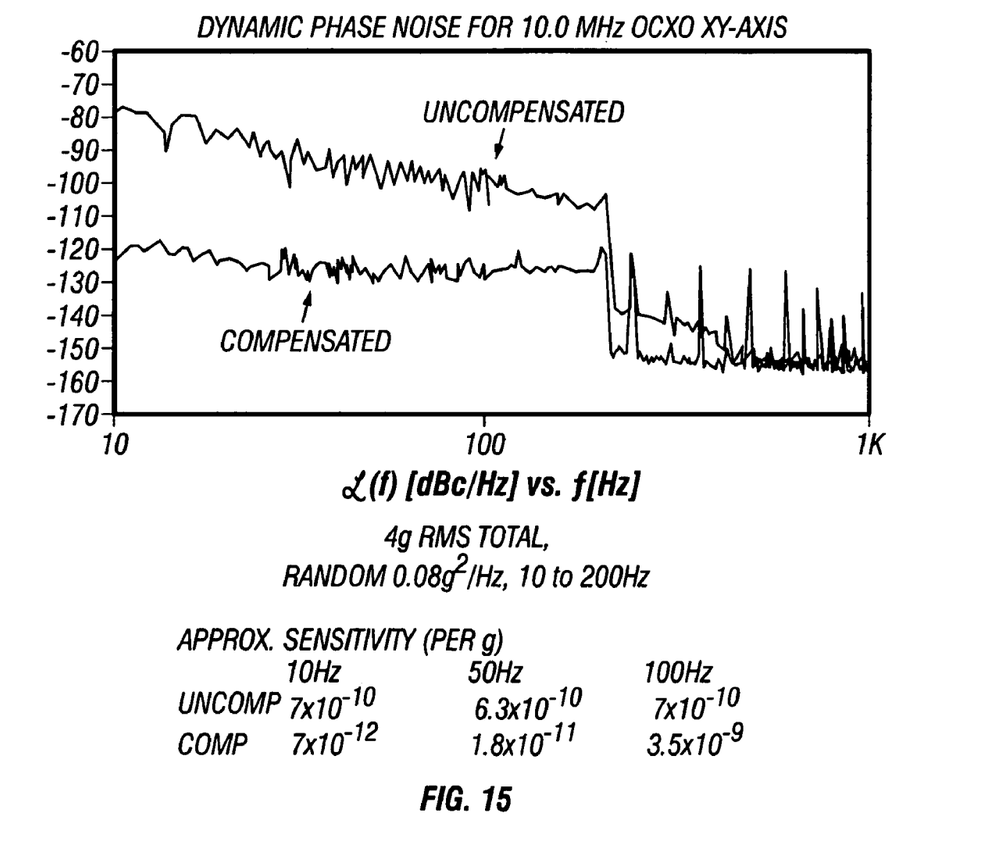
FIG. 15 is a composite graph consisting of plots of the dynamic phase noise response of another oscillator according to the invention under both compensated and uncompensated conditions while undergoing random acceleration that is applied in the xy-axis direction.
Figure 16:
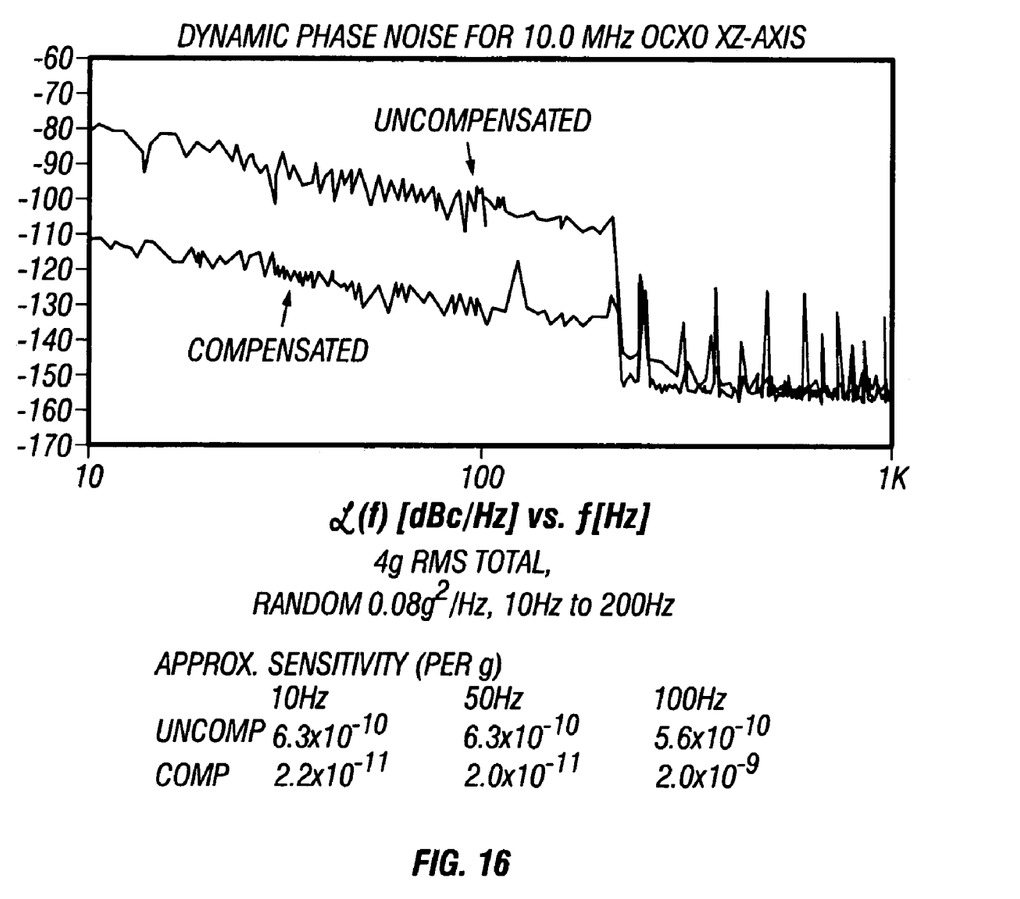
FIG. 16 is a composite graph consisting of plots of the dynamic phase noise response of another oscillator according to the invention under both compensated and uncompensated conditions while undergoing random acceleration that is applied in the xz-axis direction.

FIGS. 15 and 16 illustrate similar testing conditions and results as seen in FIG. 14.

Figure 17:
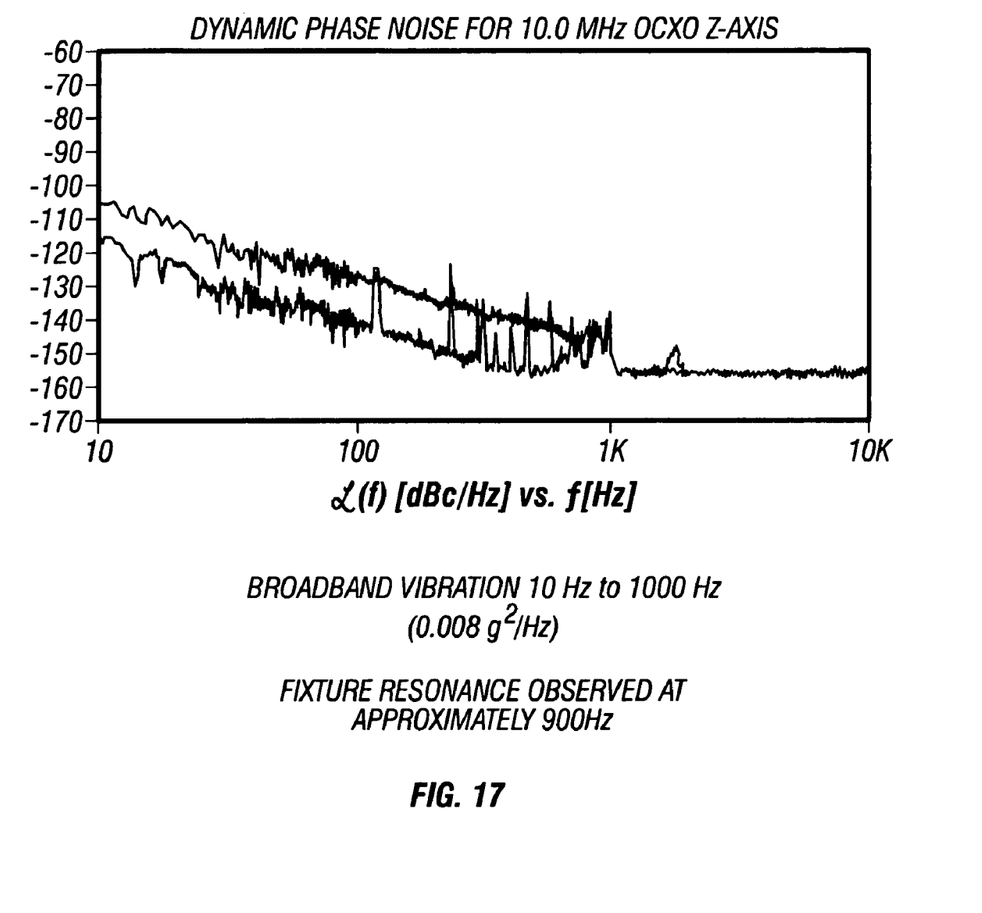
FIG. 17 is a composite graph consisting of plots of the dynamic phase noise response of another oscillator according to the invention under both compensated and uncompensated conditions while undergoing random acceleration from 0 Hz to 1000 Hz that is applied in the z-axis direction.

The graph shown in FIG. 17 illustrates the effects of broadband vibration from 10 Hz to 1000 Hz. As can be seen, the degradation has been significantly reduced.

Fabricating an oscillator according to the process 400 effectively results in an acceleration-insensitive oscillator. The oscillator fabricated from the process 400 will compensate a crystal that exhibits a g-sensitivity of $2 \times 10^{-9}/g$ to an effective performance of $2 \times 10^{-12}/g$. Optimization techniques can result in complete cancellation of the effects of acceleration. The output can be reduced to the level of static phase noise shown in FIG. 13.

While the invention has been described and illustrated in connection with preferred embodiments, many variations and modifications as will be evident to those skilled in the art may be made without departing from the spirit and scope of the invention, and the invention is thus not to be limited to the precise details of methodology or construction set forth above as such variations and modification are intended to be included within the scope of the invention.

What is claimed is:

1. A method for producing an improved oscillator that will generate an accurate frequency when encountering a vibration, the method comprising:
   positioning a resonator crystal having minimal cross-axis coupling inside the oscillator;
   positioning a first accelerometer inside of the oscillator such that the accelerometer accurately measures any vibration encountered by the oscillator; and
   maintaining the first accelerometer and the crystal at constant temperature to minimize phase shifts and gain variations.

2. The method of claim 1, wherein the first accelerometer is manufactured using MEMS technology.

3. The method of claim 1, wherein the first accelerometer is manufactured using nanotechnology.

4. The method of claim 1, further comprising using an adhesive to position the first accelerometer inside of the oscillator.

5. The method of claim 1, further comprising using one or more brackets to position the first accelerometer inside of the oscillator.

6. The method of claim 1, wherein the crystal resonator is positioned within a crystal housing inside of the oscillator.

7. The method of claim 6, wherein the crystal housing partially covers the crystal resonator.

8. The method of claim 6, wherein the first accelerometer is positioned on the crystal housing.

9. The method of claim 1, wherein the first accelerometer is positioned directly on the crystal.

10. The method of claim 1, further comprising receiving a signal from the oscillator indicating the vibration measurement determined by the first accelerometer.

11. The method of claim 10, further comprising compensating for the vibration measured by the first accelerometer.

12. The method of claim 1, further comprising using a second accelerometer, wherein the first accelerometer measures acceleration along one axis and the second accelerometer measures acceleration along another orthogonal axis.

13. The method of claim 1, further comprising using a second accelerometer and a third accelerometer, wherein the first accelerometer, the second accelerometer, and the third accelerometer are each mounted along an orthogonal axis to independently measure the acceleration each independent axis.

14. The method of claim 13, wherein an orthogonal axis is an x-axis, y-axis, or z-axis.

15. The method of claim 1, wherein the crystal resonator is an SC-cut crystal.

16. A method for minimizing the degradation of a frequency generated by a oscillator, the method comprising:
   using a crystal with minimal cross-axis coupling, wherein the crystal is positioned within the oscillator;
   attaching at least one accelerometer manufactured using MEMS technology to a surface of the crystal housed within the oscillator such that the at least one accelerometer lies parallels to an orthogonal axis of the crystal; and
   positioning the crystal within the oscillator.

17. The method of claim 16, further comprising maintaining the at least one accelerometer and the crystal at a constant temperature to minimize phase shifts and gain variation.

18. The method of claim 16, wherein attaching the at least one accelerometer further comprises using one or more bracket to attach one or more accelerometer to a surface of the crystal.

19. The method of claim 16, wherein attaching the at least one accelerometer further comprises using adhesives to attach one or more accelerometer to a surface of the crystal.

20. The method of claim 16, further comprising receiving a signal from the oscillator indicating the vibration measurement determined by the at least one accelerometer.

21. The method of claim 20, further comprising compensating for the vibration measured by the at least one accelerometer.

22. A method for minimizing the degradation of a frequency generated by a oscillator, the method comprising:
   using a crystal with minimal cross-axis coupling;
   attaching at least one accelerometer manufactured using MEMS technology to a surface of a crystal housing so that the at least one accelerometer lies parallels to an orthogonal axis of the crystal, the crystal housing at least partially covering the crystal housed within the oscillator; and
   positioning the crystal and the crystal housing within the oscillator.

23. The method of claim 22, further comprising maintaining the at least one accelerometer and the crystal at a constant temperature to minimize phase shifts and gain variations.

24. The method of claim 22, wherein attaching the at least one accelerometer is done with the use of an adhesive.

* * * * *

UNITED STATES PATENT AND TRADEMARK OFFICE
CERTIFICATE OF CORRECTION

PATENT NO.        : 7,106,143 B2
APPLICATION NO. : 11/096318
DATED             : September 12, 2006
INVENTOR(S)       : Martin Bloch, Oleandro Mancini and Charles Stone It is certified that error appears in the above-identified patent and that said Letters Patent is hereby corrected as shown below:

In column 7
On line 21, replace "ax-axis, ay-axis and az-axis" with --a x-axis, a y-axis and a z-axis--

Signed and Sealed this

Twenty-eighth Day of November, 2006

JON W. DUDAS
*Director of the United States Patent and Trademark Office*